(12) United States Patent
Reichert (10) Patent No.: US 10,507,475 B2
(45) Date of Patent: Dec. 17, 2019

(54) DEVICE FOR STRUCTURING THE SURFACE OF A PRESSED SHEET OR AN ENDLESS STRIP

(71) Applicant: Hueck Engraving GmbH & Co. KG, Viersen (DE)

(72) Inventor: Jordi Reichert, Plettenberg (DE)

(73) Assignee: Hueck Engraving GmbH & Co. KG, Viersen (DE)

( * ) Notice: Subject to any disclaimer, the term of this patent is extended or adjusted under 35 U.S.C. 154(b) by 369 days.

(21) Appl. No.: 15/351,472

(22) Filed: Nov. 15, 2016

(65) Prior Publication Data

US 2017/0065989 A1    Mar. 9, 2017

Related U.S. Application Data

(62) Division of application No. 12/300,414, filed as application No. PCT/DE2007/000872 on May 11, 2007, now Pat. No. 9,529,264.

(30) Foreign Application Priority Data

May 12, 2006 (DE) .......................... 10 2006 022 722

(51) Int. Cl.
*B05B 1/24* (2006.01)
*C23F 1/02* (2006.01)
(Continued)

(52) U.S. Cl.
CPC ................. *B05B 1/24* (2013.01); *B30B 5/04* (2013.01); *B30B 15/062* (2013.01); *B44B 5/026* (2013.01);
(Continued)

(58) Field of Classification Search
None
See application file for complete search history.

(56) References Cited

U.S. PATENT DOCUMENTS 3,235,658 A * 2/1966 Levy ...................... H01J 31/50
                                                        358/296
3,632,984 A * 1/1972 Brownscombe ..... H05B 3/0095
                                                        219/388

(Continued)

FOREIGN PATENT DOCUMENTS

CN    1174335 A     2/1998
CN    1326394 A    12/2001
(Continued)

OTHER PUBLICATIONS

The last Office Action dated Jun. 30, 2015, for the parent U.S. Appl. No. 12/300,414.

*Primary Examiner* — Jethro M. Pence
(74) *Attorney, Agent, or Firm* — Michael Soderman (57) ABSTRACT

A device for structuring the surface of a metal pressed sheet or of an endless strip, comprising a support device adapted to support the metal pressed sheet or endless strip during structuring, and a spray head and a slideway adapted to permit movement of the spray head into a desired position within a plane defined by an X and a Y coordinate. The spray head is further adapted to move in a Z direction with reference to a work surface which is spanned by the X and Y direction, and the spray head is guided by means of a digitalized template that is identical to the printed image of an impregnated paper used in a further pressing process. Independent drive elements are connected to a control unit and configured to move the spray head into the desired position.

12 Claims, 3 Drawing Sheets

(51) Int. Cl.
  *C23F 1/08* (2006.01)
  *B30B 5/04* (2006.01)
  *B30B 15/06* (2006.01)
  *B44B 5/02* (2006.01)
  *G03F 7/20* (2006.01)
  *G03F 7/16* (2006.01)

(52) U.S. Cl.
  CPC .................. *C23F 1/02* (2013.01); *C23F 1/08* (2013.01); *G03F 7/2018* (2013.01); *G03F 7/16* (2013.01)

(56) References Cited

U.S. PATENT DOCUMENTS

| | | | |
|---|---|---|---|
| 4,092,198 A | 5/1978 | Scher | |
| 4,269,679 A | 5/1981 | Moura | |
| 4,459,469 A | 7/1984 | Ishima | |
| 5,183,551 A | 2/1993 | Werthmann | |
| 5,298,116 A | 3/1994 | Werthmann | |
| 5,460,687 A | 10/1995 | Douglas | |
| 5,495,803 A | 3/1996 | Gerber | |
| 5,858,106 A | 1/1999 | Ohmi et al. | |
| 6,652,054 B2 | 11/2003 | Regev | |
| 6,755,518 B2 | 6/2004 | Codos | |
| 6,849,308 B1 | 2/2005 | Speakman | |
| 6,872,321 B2 | 3/2005 | Thavarajah et al. | |
| 7,427,360 B2 | 9/2008 | Hopper | |
| 7,615,334 B2 | 11/2009 | Kim et al. | |
| 7,842,212 B2 | 11/2010 | Thiers | |
| 7,947,138 B2 | 5/2011 | Endert | |
| 2002/0189608 A1 | 12/2002 | Hao et al. | |
| 2002/0197492 A1 | 12/2002 | Hao et al. | |
| 2003/0189608 A1 | 10/2003 | Hung et al. | |
| 2005/0025549 A1 | 2/2005 | McLoone | |
| 2005/0083364 A1 | 4/2005 | Billow | |
| 2006/0007290 A1 | 1/2006 | Oshima et al. | |
| 2006/0118427 A1 | 6/2006 | Edigaryan | |
| 2007/0131558 A1 | 6/2007 | Horsthemke et al. | |

FOREIGN PATENT DOCUMENTS

| | | |
|---|---|---|
| CN | 1387481 A | 12/2002 |
| CN | 1637595 A | 7/2005 |
| CN | 1719257 A | 1/2006 |
| CN | 1723128 A | 1/2006 |
| GB | 885232 A | 12/1961 |
| GB | 1567442 A | 5/1980 |
| JP | H05338187 A | 12/1993 |
| JP | 2003-326691 A | 11/2003 |
| JP | 2005255821 A | 9/2005 |
| WO | 1994026495 A1 | 11/1994 |
| WO | 0117794 A | 3/2001 |
| WO | 0218148 A1 | 3/2002 |
| WO | 2006046411 A1 | 10/2005 |
| WO | 2005115089 A2 | 12/2005 |
| WO | 2010114420 A2 | 10/2010 |

* cited by examiner

Fig. 3

DEVICE FOR STRUCTURING THE SURFACE OF A PRESSED SHEET OR AN ENDLESS STRIP

CROSS REFERENCE TO RELATED APPLICATIONS

This application is a divisional application of U.S. Ser. No. 12/300,414 filed on May 13, 2009, which in turn is the U.S. national stage of International Application No. PCT/DE2007/000872 filed on May 11, 2007, and claims the benefit thereof. The international application and this application claim the benefit of German Application No. DE 10 2006 022 722.0 filed on May 12, 2006; all applications are incorporated by reference herein in their entirety.

BACKGROUND

This invention relates to a method for structuring the surface of a press plate or of an endless strip, whereby a surface structure is produced by applying a mask for partial passivation by means of a device, and the subsequent chemical surface treatment, as well as a device for the application of the method.

In the prior art, press plates and endless strips are manufactured by giving a pretreated sheet a structured surface by means of a screen printing process or a photosensitive layer and subsequent etching, for example. The screen printing is applied to the large-format sheet and then the sheets are subjected to a surface etching. All the areas that form the raised structured surface are thereby covered by a mask, so that the surface is etched only in the areas that can be directly attacked by the etching fluid. The etched out areas then form the profile valleys of the desired structure. After etching, the surface is cleaned and in particular the mask is removed so that the surface can be subjected to a further coating process, for example a hard chromium plating, by additional operations.

Alternatively, a photo process can be used in which first a photosensitive layer is applied. This layer must then be illuminated, using the mask provided, for the production of the structured surface. Then a development of the photosensitive layer is necessary, and in the meantime extensive rinsing operations are necessary so that the surface can be prepared and cleaned for the subsequent operations. After the development of the photosensitive layer, the result is a mask which can be used as a template for the etching process. In this process, therefore, first a lacquer that covers the entire surface is applied, this surface is then illuminated, the unhardened components are removed and only then can the developed mask be used for the etching of a structure. The reproducibility of the masks produced in this manner is very difficult and problematic, because the negative or positive with respect to the illumination of the light-sensitive layer must always be positioned exactly in the same position relative to the photo-sensitive layer, if more than one illumination and etching process are to be carried out in sequence, to create complex three-dimensional structures on the surface of a press plate. This is no longer possible, for example, when the negative or positive for the illumination of the light-sensitive layer is applied directly to the light-sensitive layer and the negative or positive is not at exactly the same distance from it at each point of the photo-sensitive layer. The reproducibility of the application of the mask is therefore of particular importance, especially when the photo process is used, to achieve a high image accuracy. The problems can thereby be increased if a three-dimensional structure is to be achieved by a plurality of illumination and etching processes that are carried out one after another, and for that purpose a plurality of masks have to be applied one after another, whereby an etching process is carried out between the applications of each two successive masks. As a result of the need for accurate positioning and the required number of corresponding masks, the production of the press plates or endless strips is very complex and expensive. The resolution of the masks that are applied is thereby dependent to a very great extent on the method used, in addition to which a significant number of process steps are necessary, which entails complex handling, in particular on account of the size of the press plates or endless strips.

It is also known from the prior art that, instead of a screen printing process, a mask can be created by the application of a wax which is chemically resistant to the etching agent used and thus allows an etching in the areas in which the surface is not covered by the wax. In this method, a printing head which sprays the wax on the surface is moved along an X axis and a Y axis to apply the required structure by a series of individual operating procedures. In this method, the mask is therefore applied directly to the press plate and without any intervening processes via the illumination, development and removal of the undeveloped parts of the lacquer. Theoretically, the print heads used can be constructed in a manner similar to those of an ink jet printer, except that instead of an ink a wax is sprayed which hardens on the surface of the press plate or endless strips, after which the necessary etching can be performed. Although enormous progress can be achieved with this method described in the prior art, it has been found in practice that the removal of the wax lacquer is very problematic because the wax cannot be removed with a chemical treatment and thus the cleaning of the sheets after the etching process is an extremely complex process and can be performed, for example, only with a high pressure cleaner. This process also takes a great deal of time, and if a plurality of wax layers must be applied one after another and an etching process is carried out between the application of each two successive masks to achieve a three-dimensional structure, for example, it has no significant advantages. On account of the characteristics of the wax, there are limits to the accuracy and structural detail of the mask that can be achieved, so that in particular the resolution required for precisely detailed structures cannot be achieved. The limits are set by the purely physical adherence of the wax by wetting, because when hot liquid wax is sprayed onto the cold press plate, the wax hardens too quickly and forms incompletely wetted structures similar to a "dry joint". Nor is heating the pressed plate successful, because in that case the liquid wax runs and reduces the resolution that can be achieved.

DETAILED DESCRIPTION

Against this background, the object of this invention is to describe a method and a device with which the disadvantages of the methods and devices described in the prior art can be overcome and the reproducibility and resolution of the masks achieved is significantly improved.

The invention teaches that this problem can be resolved by the use of a UV-hardening lacquer that is at least partly hardened for the mask, whereby the UV-hardening lacquer is applied with the device and is irradiated at least partly with UV light immediately after the application, preferably in a period of up to 60 seconds, for hardening, whereby the press plates or endless strips are placed for the processing on a work table that has a flat surface. Additional advantageous realizations of the invention are described in the dependent claims.

As a result of the use of a UV-hardening lacquer and a suitable device provided for its application, the required mask can preferably be applied directly to the press plate or endless strip in a single printing and etching process, as well as optionally in a plurality of printing and etching processes, and it is possible to achieve an at least partial hardening of the UV-hardening lacquer by means of a UV light source, so that a particularly good adherence to the surface of the metal is guaranteed. During the operations of transporting the press plates or endless strip, it is further guaranteed that the connection between the lacquer and the surface of the metal guarantees a high degree of adherence, so that during the subsequent etching process, an under-etching and thus variations in the specified surface structure will be prevented. When a printing head is used, the UV-hardening lacquer can be applied significantly more accurately and above all more precisely to the surface, and immediately after the application of the UV-resistant lacquer, a partial hardening can be performed, so that a destruction or blurring of the mask is prevented. The partial hardening is called "freezing" in English, from which the German term "gefreezed" has been derived. For the application of the mask, the press plate can be placed on a work table that has a flat surface, for example.

An additional particular advantage is that a significantly deeper etching can be performed than is possible with the use of wax or conventional masks, for example with the use of a screen printing process. Thus, for example, a significantly improved surface structure of the press plates or endless strips can be produced, which can optionally also contain a three-dimensional structure. The press plates or endless strips produced using this method also enable the user of the press plates to print more accurately structured surfaces which, because of the digitization of the masks currently used, are identical to the papers impregnated with synthetic resin that are used, so that a surface quality can be achieved which makes it possible to more accurately match the registers of the impregnated papers. As a result of a plurality of printing and etching processes, it is also possible to achieve a three-dimensional structure that comes very close to the appearance of a natural surface, e.g. of the type that is present on a wooden structure, for example.

The special characteristic of the method claimed by the invention is also that two technologies can be combined with one another which were previously considered to be incompatible. Using the wax technology, the mask was applied directly and without the need for additional processes to the press plate, while on the other hand the screen printing mask which is produced by means of a developed UV-hardening lacquer, requires the complete coating of the materials to be processed and, after the application of a mask, a subsequent illumination and development of the UV-hardening lacquer, in addition, the undeveloped part of the UV lacquer must be removed before the etching can be performed. As a result of the method claimed by the invention the advantages of both methods can be combined and a high resolution of the surface structure can be achieved.

During the production of the mask, the press plates or endless strips are held in a flat position so that, among other things, it can be guaranteed that the distance of the spray heads from the surface of the press plates or endless strips remains constant.

The invention teaches that shortly after the application or spraying by the print head, the lacquer is illuminated until the lacquer partly hardens. The lacquer thereby remains flexible for handling, does not run and can be hardened at the conclusion of the process by a repeated illumination. To prevent a running of the UV-hardening lacquer, preference is given to the use of a UV-hardening lacquer that contains reduced proportions of solvent.

To prevent the formation of irregularities on the surface and to preserve the viscosity of the lacquer until the individual sections of the mask have been produced, the invention further teaches that the UV-hardening lacquer is preheated prior to its application and is applied at a constant temperature. Tempering of the lacquer and/or press plate from 50° C. to 100° C. has been found to be advantageous. Particularly good results have been obtained at a temperature from 65° C. to 75° C.

In one particular embodiment of the method claimed by the invention, the lacquer, preferably a UV-hardening lacquer produced by the US manufacturer "Markem", is preheated to 70° C. and is optionally applied to a tempered press plate by relative pressure.

For the production of the mask, a print head which consists essentially of a spray head with a nozzle matrix can be used, or the UV-hardening lacquer can be applied by a printing process in which, after the application of the mask, the mask is at least partly irradiated with UV light. The irradiation can be performed immediately after the application, especially when a spray head is used, wherein within a period of up to 60 seconds the UV lacquer is first partly hardened, i.e. it is hardened on the surface without a full hardening of the UV lacquer all the way through so that it remains elastic and retains sufficient elasticity during further handling to prevent chipping or flaking when the sheets are bent. Therefore the UV-hardening lacquer is only partly hardened, as a result of which the hardness can be controlled by controlling the duration of the UV irradiation and by controlling the luminous intensity applied.

Preferably a spray head, in particular a nozzle head, is used for the application of the UV-hardening lacquer, in which case the nozzle head has a plurality of nozzles which are arranged in the form of a matrix and each of which can be actuated individually. The nozzle head itself is held so that it can move in the X or Y direction in a plane, so that by means of a computer-assisted control unit, in particular a PC, the nozzle head can be moved in any desired direction in the manner of a plotter. In this case, further care must be taken to ensure that the nozzle head is guided at a short distance, preferably 0.1-4 mm and particularly preferably 0.8 mm, from the surface of the press plates or endless strips.

In one particular configuration of the invention, the spray head is held continuously at the same distance from the substrate by a servomotor to compensate for minor distortions of the very large press plate. For this purpose the spray head can be moved vertically, i.e. in the Z direction. The processing can thereby be carried out in a horizontal or vertical position, and optionally also in an inclined position, whereby the press plates or endless strips are placed on a work table which has a flat surface and a vacuum can also be applied to the press plates so that an immovable position of the press plate is guaranteed during the entire processing process. In this regard, special consideration must be given to the fact that the press plates can currently be up to 3 m wide and up to 8 m long, and the application of the mask therefore requires a certain period of time.

To prevent a running of the UV-hardening lacquer of the mask as the result of the application of an excessive quantity of lacquer at any point during one of the steps in the process, the invention teaches that the mask to be created is built up in a plurality of separate operations, whereby in particular a plurality of individual nozzles of the matrix are addressed as the print head travels across the surface, so that the sprayed dots are gradually expanded into a line and the desired mask results. For this purpose, a two-dimensional matrix is guided over the substrate. This matrix is addressed so that the entire matrix travels multiple times over an extremely small dot to be printed. Thereby each dot to be printed is printed by a matrix point selected at random. When a print head has 256 nozzle heads, for example, which are realized in the form of a 16×16 matrix and the print head travels twice over a dot to be printed so that it is sprayed by different rows of the matrix, there are 32 possibilities for the printed dot to be printed by a nozzle selected at random. If the line advance is also varied randomly, there are 16×16=256 possibilities that the dot will be printed by a single nozzle. This number can be increased even further if more than one nozzle sprays ink or UV-hardening lacquer on a dot to be printed. As a result of this randomly influenced selection of the spray nozzle that does the actual printing, thin lines or systematic printing errors are prevented from being reproduced on the press plate, of the type that can be caused by imperfect mechanical equipment or even by minimal vibrations during the printing.

A particular problem occurs during the printing of the pattern on a polished surface of the press plate. In this case stray UV beams strike the print head during the post-illumination and thus can cause the destruction of the print head when parts of the UV-hardening lacquer come detached. There are a number of different solutions that can be successfully employed to prevent this problem.

First it is possible to chemically roughen the surface of the press plate so that the press plate has a dull appearance. As a result, the light is more effectively absorbed and does not stray into the print head.

An additional possibility is the use of a filter which allows only the UV radiation to pass that is completely absorbed by the press plate substrate.

An additional solution has been found to be successful in preventing the clogging of the print head. For this purpose laser diodes or UV diodes are used which emit a pulse of light only during the brief period in which the print head performs a pump surge. During this period, although any lacquer that is adhering to the print head absorbs the radiation, this lacquer is immediately ejected and does not stick to the valve, which would cause the lacquer to clog the nozzle and destroy the print head. Because all the nozzles in the print head used regularly perform pump surges, there are no valves that can become stuck in the closed position.

It is also possible to use a black mask which prevents a reflection of the UV light [and/or to] use a lampshade which is guided very close above the surface of the substrate which is to be partly hardened and a tracking of the UV lamp which is controlled so that the UV lamp and the print head are not active when they are in the immediate vicinity of each other, in which case the UV lamp alone is guided so that it moves in the direction opposite to the print head or trails the print head.

In an additional realization of the invention, for the application of the mask, the press plates or endless strips are subjected to a pre-treatment, e.g. a mechanical cleansing and cleaning with isopropanol, ethanol or spirits, and optionally a pretreatment with a primer, such as with an organic silyl compound, for example. The purpose of this pre-treatment is to ensure that a particularly solid surface adherence is achieved and the UV-hardening lacquer can be applied directly to the press plates or endless strip, in addition, the surface of the press plates or endless strips can be slightly etched. During the production of the mask, the print head itself is moved along the long edge of the press plate or endless strip being manufactured, in which case it is moved back and forth preferably along the X axis and in addition along the Y axis, i.e. at a right angle to the X axis, whereby the step width of the movement in the direction of the X axis equals the width of the matrix plus or minus the distance between the neighboring nozzles of the matrix divided by the number of matrix rows, so that during the process, the mask is partly built up along the Y axis by the individual nozzles, and then a performs a movement by the step width in the direction of the X axis, so that the mask can be completely built up with a high resolution after a plurality of steps along the X axis.

Subsequent to the creation of the mask a conventional, known etching technology is used for the chemical treatment of the surface, and after the completion of the etching process, the surface can be treated by rinsing with a cleaning and neutralization agent, whereby simultaneously the mask applied can be removed without difficulties. For the removal of UV-hardening lacquer which is in valleys of the structure, an ultrasound oscillator is also used, which removes lacquer residue from the structural valleys by cavitation.

For a post-treatment, the press plates or endless strips were provided with a lacquer, whereby the press plates or endless strips are chromium plated over the entire surface for the post-treatment, preferably hard chromium plated, or coated with adamantine carbon or with titanium boride.

For the application of the method, the invention also teaches a device which comprises a support device for the materials to be processed, a spray head and a slideway for the movement of the spray head into the desired position inside a plane defined by an X and Y coordinate, as well as independent drive elements to reach the position and a control unit. In this case, the control unit is used, with the help of the drive elements, to move the spray head into the defined position which is specified by the digitized image of the mask to be created. Preferably, a slideway is provided which guarantees a highly reproducible accuracy of the respective position and simultaneously guarantees that the spray head can move in both the X and Y directions. To maintain a uniform distance from the surface of the materials to be processed, this slideway is constructed taking the specified maximum size into consideration so that no sag can be caused by the dead weight of the spray head. To compensate for minimal variations in distance caused by temperature fluctuations, minimal sagging of the slideway or a distortion of the press plates or endless strips, the invention teaches that the print head is kept by means of a leveling device at a constant distance from the surface of the press plate by movement in the Z direction to thereby achieve a constant printing quality.

In particular, this measure guarantees that the distance of the spray head from the surface of the materials to be processed Is kept constant. So that the material being processed cannot slip during the application and is held in the correct position, the application device claimed by the invention is provided with a flat surface, whereby the material to be processed is also held in place by a vacuum.

The nozzle head itself is equipped with a plurality of nozzles in the form of a matrix, whereby each of these nozzles can be actuated individually and is guided so that it moves at a slight distance from the surface of the materials to be processed, which distance is preferably 0.1-4 mm and particularly preferably 0.8 mm. In the method claimed by the invention, the mask is build up by a plurality of separate operations, whereby the nozzle head is moved stepwise along an X axis and after every process step the nozzle head is first moved in the direction of the Y axis before there is a further movement along the X axis. For this purpose, the nozzles of the nozzle head are located next to one another in an X and Y direction, whereby the nozzles are functionally combined into groups of at least two nozzles each, and whereby the nozzles and/or the press plates or endless strips, after the processing, are moved in the direction of an X axis into a new position and the step width of the movement in the direction of the X axis equals the group width plus or minus the distance between the neighboring nozzles of the group divided by the number of groups.

The support device for the materials to be processed is thereby held in an approximately horizontal or vertical position, whereby, depending on the intended use, a position that is inclined in relation to the vertical can also be selected.

To maintain the planarity of the support surface, the support device is provided with individual flat sub-surfaces, whereby inside the sub-surfaces there is a suction opening which is directly connected with a vacuum device so that each sub-surface can be used simultaneously as a contact surface and suction surface for the material to be processed, so that a uniform and flat contact is guaranteed over the entire surface of the workpiece to be processed. This measure compensates for undesirable deviations from planarity.

For the partial hardening of the applied UV-hardening lacquer, the nozzle head is further equipped with a UV lamp which, after the completion of the mask which is applied in sections, directly illuminates the finished segment so that first the UV-hardening lacquer is partly hardened. The significant advantage of this measure is that any potential running of the UV-hardening lacquer is prevented and also a stability against smudging is achieved which prevents a destruction of the applied mask during the additional processing steps. To prevent a chipping or flaking of the UV-hardening lacquer from the surface of the press plates or endless strips, the invention teaches that the lacquer is not completely hardened.

The nozzle head further has a screen which prevents the incompletely applied mask or individual dots of the mask structure from being illuminated prematurely during the process, because such premature illumination could cause them to harden. The UV lamp used is a mercury vapor lamp or a xenon lamp, whereby optionally UV power LEDs can also be used which, on account of their narrowly defined irradiation angle, illuminate a precisely defined area of the mask and thus make possible a direct tracking with the spray head after the mask has been completed. It is also possible, however, to use pulsed lasers, laser diodes, simple UV-LEDs or lamps with an interference filter or a filter that has a similar effect.

The particular advantage of the method is that a mask can be applied with high precision and reproducibility on a pre-treated press plate or endless strip by means of the device claimed by the invention, and a rapid cleaning of the press plate or endless strip for further processing is guaranteed by the UV-hardening lacquer used. The UV-hardening lacquer itself is resistant to the majority of acids and is therefore extremely well suited for the passivation of the surface, thereby making possible the execution of a subsequent etching process. By means of a computer-assisted movement of the spray head, the accuracy and reproducibility of the process within the required scope are guaranteed, and in particular on account of a digitized template which is identical to the printed image of an impregnated paper for a later use of the press plates, a precisely matched printing becomes possible, which results in an excellent surface structure of the surfaces that are processed using the press plates or endless strips.

The invention is explained in greater detail below with reference to the accompanying figures, in which.

DETAILED DESCRIPTION OF THE PREFERRED EMBODIMENT

Figure 1:
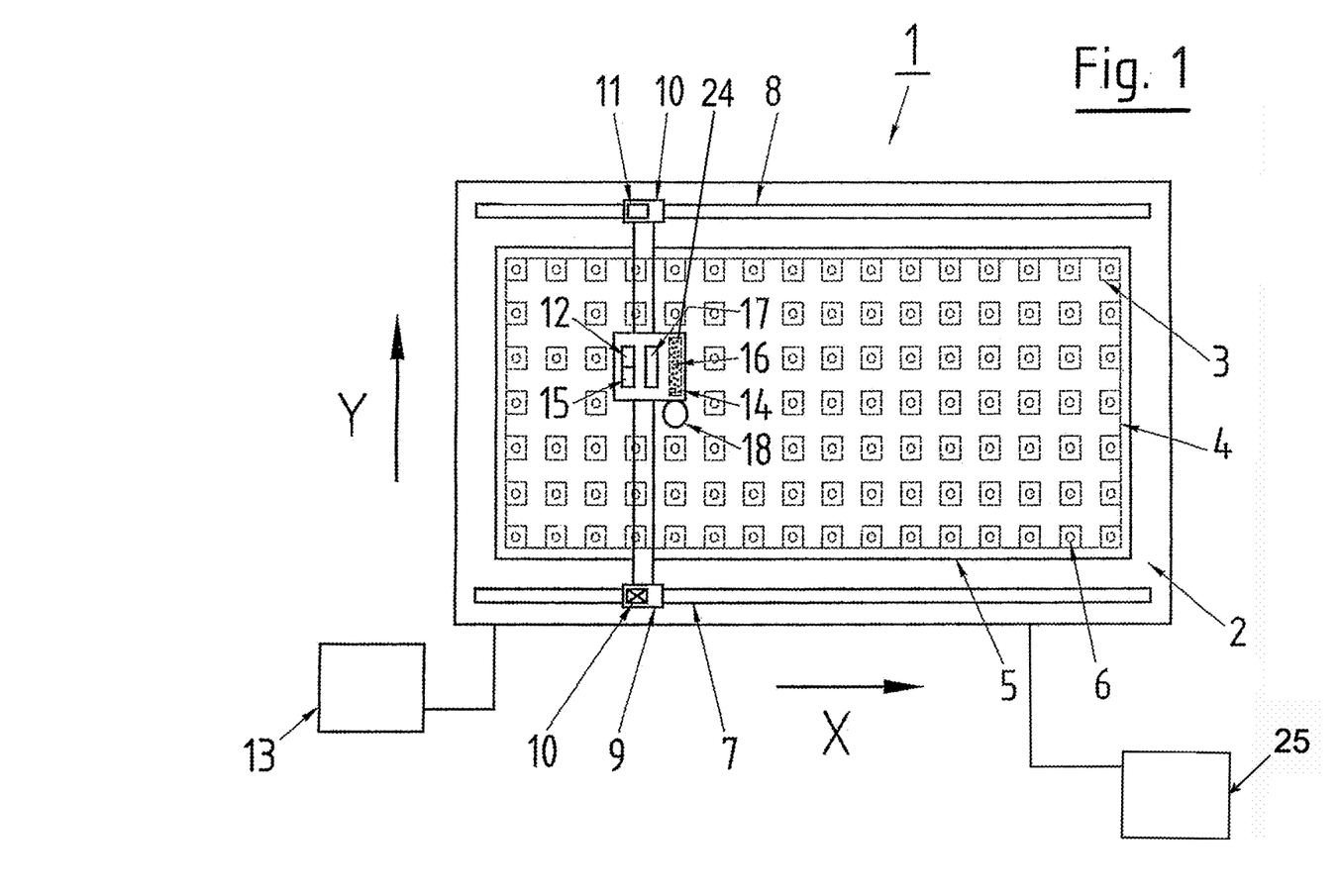
FIG. 1 is a plan view of a device claimed by the invention for the processing of a press plate.

FIG. 1 shows, in a plan view, a device 1 for the application of the method claimed by the invention. The device consists of a support table 2 with a support surface 4 which consists of a plurality of individual flat surfaces 3, and on which a press plate 5 is supported. In each of the flat surfaces 3, a suction opening 6 is realized which, by means of a vacuum pump (not shown) pulls the press plate 5 onto the flat surfaces 3 and thus guarantees an immovable position of the press plate 5 throughout the process.

In the illustrated embodiment, the device 1 is oriented in a horizontal position, although it is of course possible to orient the device 1 in a vertical position or in a position that is inclined with respect to the vertical to perform the processing of the press plate 5. Along the largest dimension of the press plate 5 there are guide rails 7, 8, along which slideways 9, 10 can be moved, and specifically by means of drive motors 11, 12 which are controlled by means of a control device 13, preferably a computer-assisted control device. By means of the drive motors 11, 12, the spray head 14 is moved stepwise in the direction of the X axis and in the direction of the Y axis, whereby by means of an additional drive motor 15, additional movements are executed in the Z axis to level the spray head 14. The spray head 14 itself consists essentially of the nozzle matrix 16, a reservoir 17 for the lacquer to be sprayed and at least one light source 18 which illuminates the at least partly completed mask after a defined period for a defined length of time and thus results in an at least partial hardening of the UV-hardening lacquer.

Figure 2:
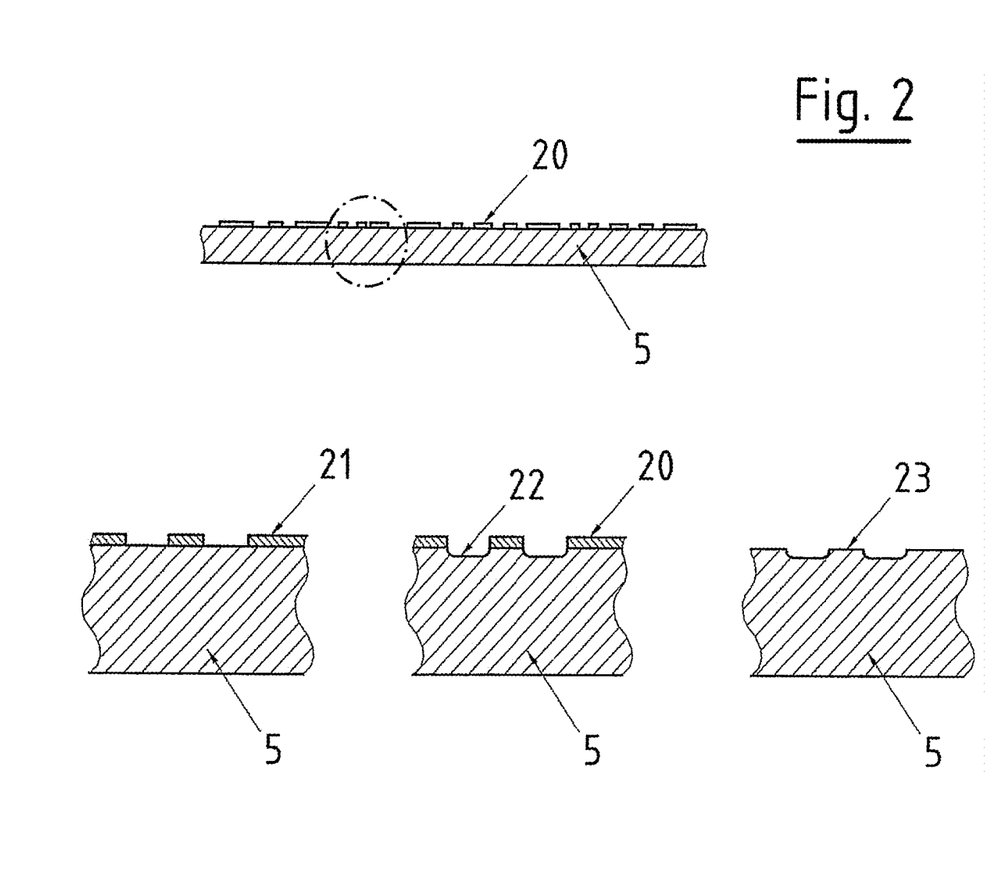
FIG. 2 is a view in section of a press plate in various steps of the process.
Figure 3:
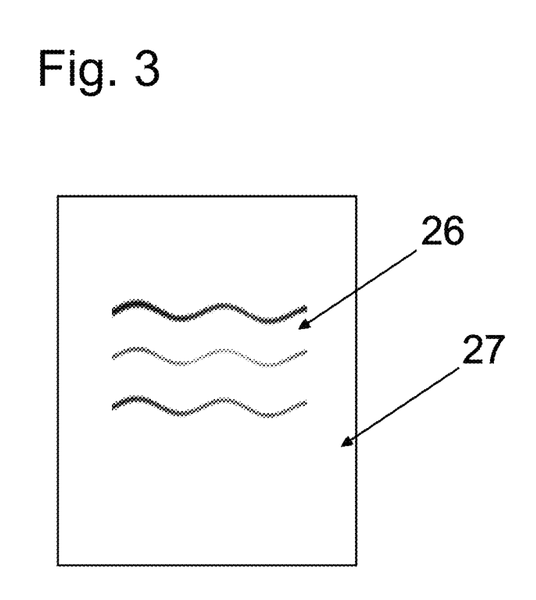
FIG. 3 is a view of impregnated paper with a printed image that corresponds to the design in the digitalized template.
Figure 4:
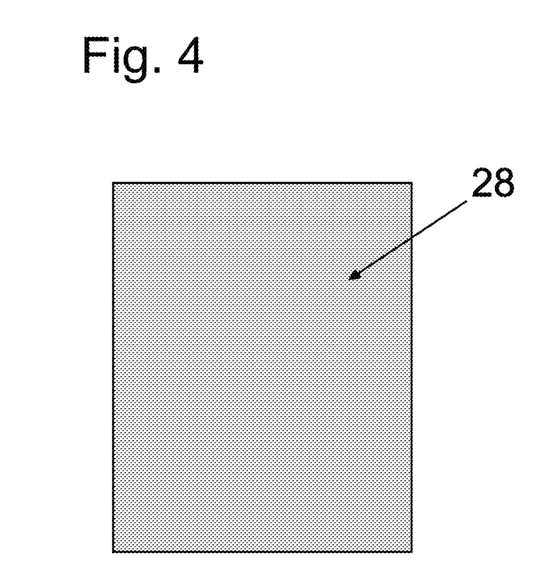
FIG. 4 is a view of the black mask or lampshade that can be adapted to shield the nozzle and protect the nozzle against undesired reflections of light.

FIG. 2 shows, in an enlarged detail, a press plate 5 with a mask 20 which was applied using the method described above and the device illustrated in FIG. 1. The enlarged detail in the left-hand part of the figure shows that the UV-resistant lacquer 21 was applied partially to the press plate 5. After the performance of the etching process, which is illustrated in the middle section of the figure, the mask 20 is still on the surface of the press plate 5, although the areas 22 that are not covered by the mask are partly etched, so that a depression has been created. Following a subsequent cleaning, e.g. of the type illustrated in the right-hand section of the figure, the press plate 5 in the illustrated embodiment has a structured surface 23 on one side which, after it has been cleaned and the mask 20 has been removed, corresponds to the customer's specifications. The structured surface 23 can optionally be structured in terms of depth, i.e. three-dimensionally, by additional etching processes. Both sides of the press plate 5 can also be processed in the manner described above.

To achieve a maximum resolution in the creation of the mask, an additional method is used to control the nozzles during each printing process, whereby the nozzles are functionally combined Into groups. These groups can comprise 2-4 nozzles, but also a different number of nozzles, which are actuated according to a single plan. At the desired time, the first group of nozzles is thereby moved so that it is above the workpiece, whereupon the spray head is moved once along the workpiece over its total length in the Y-direction relative to the workpiece and UV-hardening lacquer is simultaneously sprayed out of the nozzles. Then at a later time the spray head is moved along the X axis as long as necessary until an additional selected group of nozzles overlaps the surface of the workpiece, whereby the step width is selected so that it equals the group width of the nozzles minus the distance between neighboring nozzles divided by the number of groups. It is thereby guaranteed that during the second relative movement between the print head and the workpiece, there will be no overlap between the pattern produced by the second group and the pattern produced by the first group, but that these patterns will complement each other with the maximum resolution. Then the print head is moved further by the group width, minus the distance between neighboring nozzles, in the direction of the X axis. Then there is another relative movement between the print head and the workpiece across the entire width of the workpiece in the direction of the Y axis, as a result of which a neighboring pattern of the UV-hardening lacquer is sprayed onto the workpiece with maximum resolution. As soon as the last group of nozzles, after the relative movement between the print head and the workpiece, has again been displaced by one step width in the direction of the X axis, the mask consisting of the UV-hardening lacquer corresponding to the first group width is completed in maximum resolution. A plurality of these group widths are contiguous to one another and thereby produce the entire mask to be created.

LIST OF REFERENCE NUMERALS

1 Device
2 Support table
3 Flat surface
4 Support surface with plurality of sub-surfaces
5 Press plate
6 Suction opening
7 Guide rail
8 Guide rail
9 Slideway
10 Slideway
11 Drive motor
12 Drive motor
13 Control device (containing digitalized template)
14 Spray head/nozzle head, which may contain shield
15 Drive motor with automatic leveling device
16 Nozzle matrix/plurality of nozzles
17 Reservoir
18 Light source
20 Mask
21 Lacquer
22 Area
23 Structured surface
24 Individual nozzle
25 Vacuum device
26 Printed image
27 Impregnated paper
28 Black mask/lampshade

The invention claimed is:

1. A device for structuring a surface of a metal pressed sheet or of an endless strip, comprising:
   a support device adapted to support the metal pressed sheet or endless strip during structuring;
   a spray head and a slideway adapted to permit movement of the spray head into a desired position within a plane defined by an X and a Y coordinate, the spray head is further adapted to move in a Z direction with reference to a work surface which is spanned by the X and Y direction, said spray head being guided by means of a digitalized template that is identical to a printed image of an impregnated paper used in a further pressing process; and
   independent drive elements connected to a control unit and configured to move the spray head into the desired position, wherein the spray head comprises a nozzle head for the application of an ultraviolet (UV) hardening lacquer and the nozzle head is equipped with an ultraviolet (UV) light source attached directly thereto that irradiates a completed section of a mask applied in sections, and wherein the nozzle head is guided at a constant distance of 0.1 to 4 mm from the surface of the pressed sheet or endless strip by means of an automatic leveling device directly attached to said nozzle head.

2. The device of claim 1, wherein the nozzle head has a plurality of nozzles which are arranged in the form of a matrix and can be actuated individually.

3. The device of claim 1, wherein the nozzle head is guided at a short distance of 0.8 mm from the surface of the pressed sheet or endless strip, the guidance being assisted by the automatic leveling device.

4. The device of claim 1, wherein the nozzle head is adapted to build up the mask to be applied by a plurality of separate working processes.

5. The device of claim 2, wherein the nozzles of the nozzle head are located next to each other in an X and Y direction and the nozzle head is adapted to be moved in the direction of an X and Y axis, the nozzles being functionally combined into groups of at least two nozzles each, the nozzles and/or the pressed sheet or endless strip being adapted to move after the processing in the direction of the Y axis into a new position on the X axis, a step width of the movement in the direction of the X axis being equal to the width of the nozzle matrix plus or minus the distance between neighboring nozzles of the matrix divided by the number of group rows.

6. The device of claim 1, wherein the nozzle head has a shield which prevents an incompletely applied mask or individual dots of the mask structure from hardening during the processing.

7. The device of claim 1, wherein the support device is oriented in a horizontal or vertical position.

8. The device of claim 1, wherein the support device has a flat plane surface which is divided into a plurality of sub-surfaces and has, inside the sub-surfaces, suction openings for a vacuum device.

9. The device of claim 1, wherein the UV light source is/are a mercury vapor lamp, xenon lamp or UV power LEDs, or laser diodes or a laser.

10. The device of claim 1, wherein the UV light source is a pulsed laser, the pulsed laser being adapted to emit light exclusively when the nozzle head sprays material for the application of the mask.

11. The device of claim 1, further comprising a black mask and/or a lampshade adapted to shield the nozzle head and protect the nozzle head against undesired reflections of light.

12. The device of claim 1, wherein the UV light source or the UV lamp is adapted to follow the nozzle head at some distance or travel opposite to the nozzle head, the UV light source being turned off in the vicinity of the nozzle head when the nozzle head and light source are close together.

* * * * *